United States Patent [19]
Fielder et al.

[11] Patent Number: 5,715,200
[45] Date of Patent: Feb. 3, 1998

[54] MEMORY DEVICES

[75] Inventors: Dennis A. Fielder, Linton; James H. Derbyshire, Willingham, both of Great Britain; Peter B. Gillingham, Kanata, Canada; Cormac M. O'Connell, Kanata, Canada; Randall R. Torrance, Ottawa, Canada

[73] Assignee: Accelerix Limited, Jersey, England

[21] Appl. No.: 682,661

[22] PCT Filed: Nov. 29, 1995

[86] PCT No.: PCT/GB95/02780

§ 371 Date: Oct. 1, 1996

§ 102(e) Date: Oct. 1, 1996

[87] PCT Pub. No.: WO96/17354

PCT Pub. Date: Jun. 6, 1996

[30] Foreign Application Priority Data

Nov. 29, 1994 [GB] United Kingdom ............ 9424100

[51] Int. Cl.⁶ .................................. G11C 7/00; G11C 15/00
[52] U.S. Cl. ................... 365/159.12; 365/49; 365/240
[58] Field of Search .......................... 365/189.12, 49, 365/240

[56] References Cited

U.S. PATENT DOCUMENTS

| | | | |
|---|---|---|---|
| 4,685,082 | 8/1987 | Cheung et al. | 365/49 |
| 5,383,146 | 1/1995 | Threewitt | 365/49 |
| 5,450,351 | 9/1995 | Heddes | 365/49 |
| 5,588,130 | 12/1996 | Fujishima et al. | 365/49 |

*Primary Examiner*—Son T. Dinh
*Attorney, Agent, or Firm*—Watson Cole Stevens Davis, PLLC

[57] ABSTRACT

A memory device with a dynamic random access memory (DRAM) having an array of a plurality of rows and columns of memory elements; a cache memory formed integrally with the DRAM and includinmg at least one register with a plurality of memory elements and connected in pitch-matched relation to the DRAM array, the number of memory elements in a row of the DRAM being n times the number of memory elements in the at least one register, n being an integer greater than or equal to 2; and a connector for connecting the at least one register to the DRAM, the connector for the at least one register being a bus having a width corresponding to the number of memory elements therein.

7 Claims, 2 Drawing Sheets

MEMORY DEVICES

The present invention relates to methods and corresponding devices for handling and storing large amounts of data in a computer in an efficient manner which alloys repeated read and write operations to the memory.

The invention is particularly related to the storage and use of data in RAM, and has application for instance in computer graphics devices.

Computers include Random Access Memory (RAM) which is used during the operation of a computer to store data relevant to the operation of the computer, such as program information or graphics data. Such data is supported only while the computer is switched to provide power to the memory, but RAM is used due to its faster access speeds compared with permanent memory devices such as magnetic storage media.

For example, typical computer display systems have a display memory implemented in RAM which has stored in it information concerning the required parameters for each pixel of a screen display. This memory is repeatedly read and the information is passed to the display screen whereby the screen reflects the contents of the memory. When the computer wishes to alter the image displayed on the screen it acts to alter the corresponding information in the display memory, these changes subsequently being reflected on the actual screen. Therefore the performance of a graphics display system, and other sub-systems of the computer which utilizes RAM, is dependent to a large extent on the ability quickly to read and write data to and from the memory.

Many systems use Dynamic Memory (DRAM) to store the information because of the high density achieved by DRAM memory compared to Static Ram (SRAM), typically at least four times denser measured by silicon area per bit. This benefit is gained at the expense of speed of access to the memory, where SRAM of the required size will alloy memory cycles to occur at typically 30 ns intervals but DRAM will typically require 120 ns intervals. The rest of the system which is trying to modify the memory contents can work at SRAM speeds, so considerable effort is expended to design systems which use DRAM for cost benefits but achieve SRAM performance. The standard approach to this problem is to use cache memory techniques, applied at various levels of the system.

The lowest level at which this technique is applied is to use "page mode" DRAM cycles, where the memory device retains a row of bits read once from the two dimensional array of storage elements within the device, allows these bits to be read or modified at speeds nearly as fast as SRAM, them finally writes the modified row back into the DRAM storage array if needed. This can achieve about four times enhancement if many accesses are made to the same row without intervening accesses to other rows, but the advantage decreases as multiple real-time requests are made to the memory system, increasing the overhead of the initial read row and the final write row operations. The conventional solution to this second problem is to add First In First Out (FIFO) buffers onto each access path into the memory, allowing bursts of sequentially addressed values in the same row to be kept together. These FIFOs can take considerable area of silicon to implement.

The second level at which this technique is applied is to put a small SRAM within the memory, e.g. graphics controller, which is separate from the memory device, and use it to store information accessed from the DRAM in case it is needed again in the near future, in which case the requested data is provided from SRAM at SRAM speed. Multiple writes to the cache memory can also occur before the final result is written back into the DRAM.

The highest level of cache within the graphics controller is a simple "write buffer", which accepts the address and data from the host system and allows it to continue immediately. The write buffer contents are then written into the memory at slower speed. This technique speeds up operation as long as gaps occur between the write cycles, if they are continuous then the operations proceed at the slower rate of the DRAM cycle. A "read buffer" can also speed up operation if it anticipates the host machine reading a certain location and reads the value into a buffer before it is needed, ready for immediate access. Since many operations in particular in graphics systems proceed sequentially through memory then this anticipation can achieve reasonable accuracy. Again this works effectively if gaps occur between the reads. Each of these buffers can be expanded by allowing a number of read or write cycles to be queued in the buffer at the expense of additional silicon area and added complexity.

The improvements which can be achieved by such arrangements are limited by the speed at which data can be read from the cache back to the main memory when a part of memory is required to be accessed which is not in the cache, to allow that portion of memory to be read into the cache. This speed is limited by the width of the bus over which data is transferred between the main memory and the cache.

Thus a further method of improving the system performance is to modify larger parts of the memory contents within a single memory cycle. If, for instance, 32 bits of memory are allowed to be modified in a single cycle then, to a first approximation, twice the performance of a system that can only modify 16 bits in a single cycle can be achieved. This argument has produced a steady increase in the bus widths between the memory and the controller, starting from 8 bits, progressing rapidly through 16 and 32 bits up to 64 bits. The introduction of 128 bits systems has been delayed by the inherent problems of this approach, namely that the large number of signals requires additional signal, power and ground pins on the controller integrated circuits, a larger area of the printed circuit board is needed for all the signals, and that extra memory devices are needed to get the memory width.

The present invention provides a memory device comprising
   a dynamic random access memory (DRAM) comprising an array of a plurality of rows and columns of memory elements;
   cache memory means formed integrally with the DRAM and comprising at least one register, the or each register comprising a plurality of memory elements and being arranged in pitch-matched relation to the DRAM array; and
   connecting means connecting the or each register to the DRAM, the connecting means for the or each register being a bus means having a width corresponding to the number of memory elements therein.

The structure of this invention considerably speeds up the operation of the cache memory and its inter-action with the DRAM. This is a result of the wide bus means which enables the content of a whole cache register to be read from or to the main memory array in one step. Typically each register may be 640 bits wide, giving an effective bus width of 640 bits, although widths greater than this for instance 5128 bits, are contemplated by this invention.

The physical location of the register or registers in pitch matched relation to the memory elements of the DRAM array further optimises the performance of the registers in conjunction with the main memory.

In a preferred embodiment three registers are attached to the memory storage array and each register can hold information from a portion of the memory, preferably one complete row of the memory contents. Operations which require use of data from the areas of memory replicated in these registers can therefore run at full speed. The registers are used as a least recently used (LRU) cache.

In a further preferred modification the registers also have adjacent raster operation (ROP) units adjacent on the silicon and these use the contents of the registers to evaluate and write back into memory modified row contents to perform simple memory operations. This permits a large number of bits to be manipulated in parallel thus achieving a large performance benefit without requiring very wide busses to be tracked across the silicon or printed circuit board.

This invention therefore has advantages such as providing a memory device that has all the benefits of page mode operation but without FIFOs being needed to remove page contention and the associated decrease in performance. Also the present invention allows the widest possible width of memory modification within a single memory timing cycle.

Further features add advantages of this invention will be appreciated from the following description of a preferred embodiment which is given by way of example with reference to the accompanying drawings in which.

Figure 1:
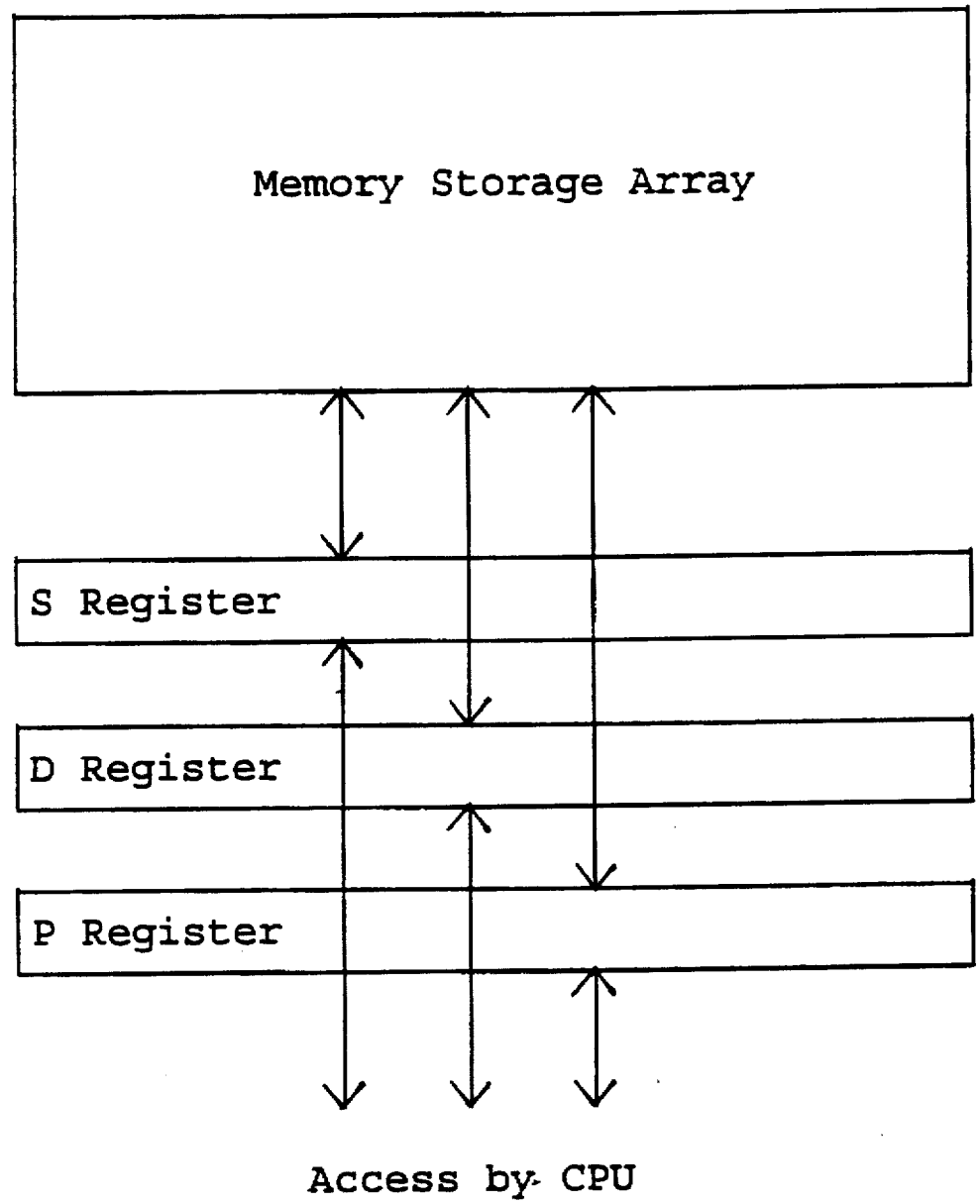
FIG. 1 is a schematic drawing of a first embodiment of this invention.

In FIG. 1 the memory storage array is the principal display memory and is implemented in this embodiment as DRAM.

The structure of the device described herein is very similar to that of the device described in application Ser. No. 08/253,271 and Korean, Japanese and European applications based thereon and thus reference should be made to those document for more detailed constructional details. The operation of the device herein is however quite different in that, in the present invention, the device is operated as a cache memory, as described above and in more detail below.

A set of wide registers are attached directly to the DRAM storage area, each register holding a complete row of the memory contents. With three registers the benefit is gained of having effective use of 3 pages of the DRAM, allowing operations which require sequential use of values from 3 areas of memory to run at full sliced. These registers are laid out in a pitch matched form adjacent to the memory array for maximum speed and area efficiency. The registers are used as a least recently used (LRU) cache to speed up operations on the memory.

When accessing memory for the purpose of altering the stored data, it is often necessary to interleave accesses to several distinct areas of the memory. Since these three areas are typically on different rows of the memory devices, the page mode operation of the memories is of limited benefit. The prime problem is that only one "page" can be active at any instant.

The first step in the new approach is to add a number of registers, called herein S, D and P, directly to the memory array which can each hold a row of data as it is read from the store area. When an access is made to the memory the data is read first into one of the registers, then the register accessed to return the data needed. Subsequent accesses to the same row can be provided directly from the register more rapidly than from the DRAM store area. An algorithm such as least recently used (LRU) is used to decide which register should be read in to if none of the three registers have the needed row already. It is now possible to operate sequentially on values from the three areas of the memory without suffering any loss of performance due to page mode misses. The registers are implemented as part of the DRAM layout, with a layout pitch matched to that of the DRAM core technology. This has the advantage of very efficient layout saving silicon area and allowing fast operation.

The number of bits saved in each register and the number of registers does not have to be as described, it is possible to store less than a complete row of memory data in each register at some loss of performance, or to change the number of registers to higher or lower values.

Figure 2:
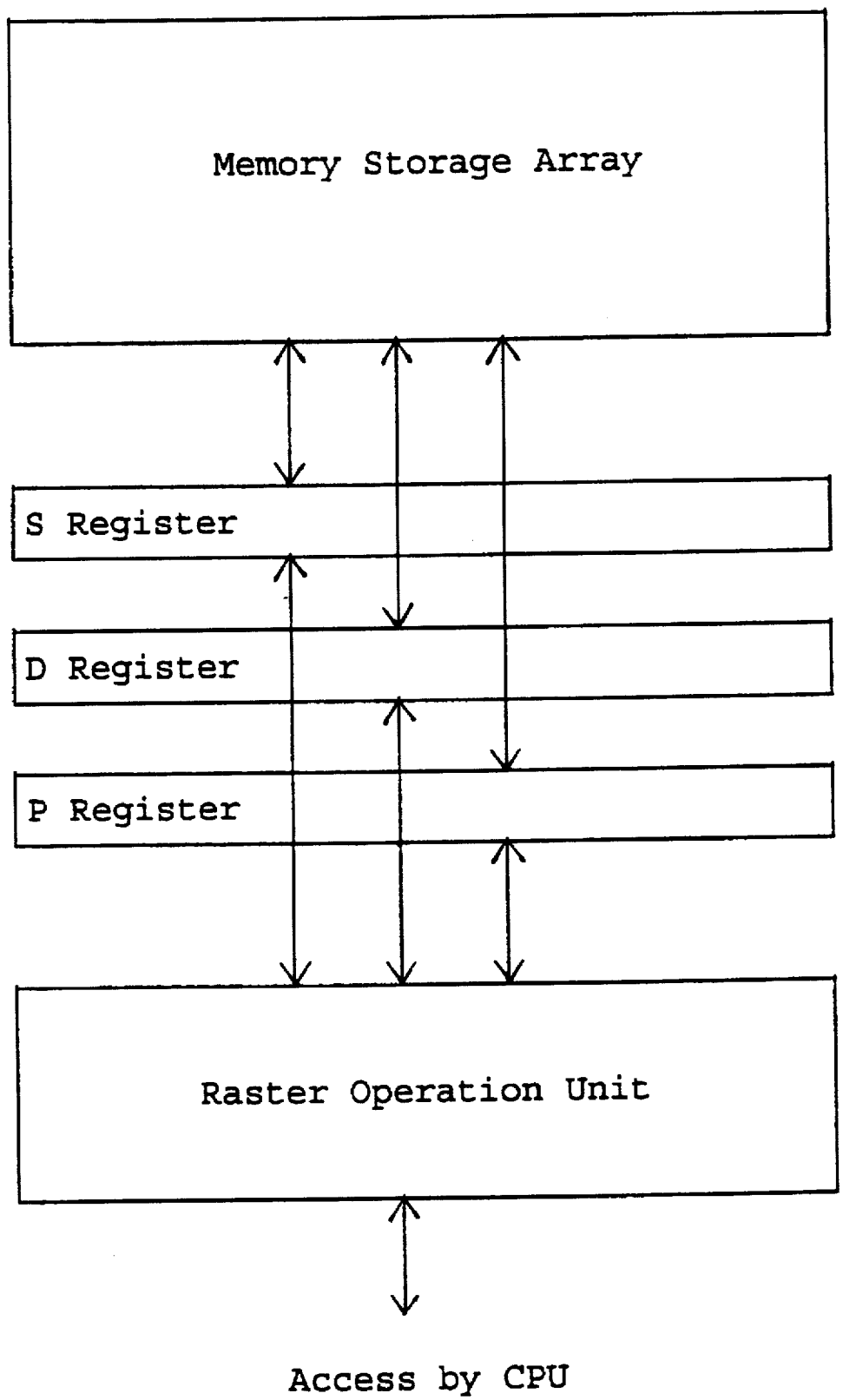
FIG. 2 is a schematic drawing of a further preferred embodiment.

While the use of the registers as described above leads to a performance enhancement, the overall benefit is still limited by the width of the databus used to access the memory. To improve this logic that performs simple memory operations, such as raster operations in a graphics system, can be replicated and attached directly to the registers, with the logic for manipulating one bit local to the register values it needs and returns the result to. This is illustrated in FIG. 2. In particular the registers also have laid out adjacent on the silicon a set of pitch matched raster operation (ROP) units which use the contents of the registers to evaluate and write back into memory a modified row contents.

This approach removes the need to transfer the data over very wide busses within the device, all the data is dealt with locally for the simple operations. The raster operation unit (ROP) is laid out in a pitch matched form to attach directly to the registers so achieves high area efficiency and high performance. The equivalent databus width to the normal architecture is now the width of a row of memory, which is typically 1024 or 2048 bits, giving a large increase in performance over that of a 64 bit wide databus system.

In a graphics system it is also advantageous to make the width of the memory row, the registers and the raster operation unit related to the width of the displayed picture, which may typically be 1280 pixels wide, so register and other widths of 1280, 640 or 320 are efficient figures. It is not necessary that all the memory, registers and ROP unit have the same width, so for instance a memory width of 1280 bits, a register width of 640 bits and a ROP unit width of 32 bits can still produce a high performance system.

The ROP unit my implement only a subset of all possible ROP functions, particularly a subset chosen to execute those functions which contribute the majority of work involved. The remaining ROP functions can then be performed by the main CPU or other processing unit at a slower rate, but with only a small overall performance loss.

The combined function of memory array, registers and ROP unit may itself be replicated on the silicon to achieve higher performance, so for instance 8 copies can be used to particularly enhance the performance of an 8 bits per pixel display system. Each bit of the pixel depth is stored in a separate block, with all 8 bits being processed in parallel. This leads to an effective data bus width which is 8 time greater, or 8×640 giving a 5120 bit wide effective databus, with a corresponding performance improvement.

There is benefit accruing from the combination of these different uses of the registers. When required for acceleration of the raster operation they provide a wide, locally available set of inputs to the ROP unit giving a large performance enhancement. When used to cache raster operations being performed by the main CPU or other processing device they provide the optimum set of cached data to prevent wasted memory cycles. Finally, when the display memory is being accessed in a unstructured way, they provide the benefit expected of a standard multi-line LRU cache plus the wide bus access to the main memory discussed above.

This integrated graphics display device can be used particularly advantageously in the system described in our British patent application 9424104.9 entitled "Multiple Bus Standards" and the International patent application based thereon.

We claim:

1. A memory device, comprising:

a dynamic random access memory (DRAM) comprising an array of a plurality of rows and columns of memory elements;

cache memory means formed integrally with the DRAM and comprising at least one register comprising a plurality of memory elements and being connected in pitch-matched relation to the DRAM array, the number of memory elements in a row of the DRAM being n times the number of memory elements in said at least one register, n being an integer greater than or equal to 2; and connecting means connecting said at least one register to the DRAM, the connecting means for said at least one register being a bus means having a width corresponding to the number of memory elements therein.

2. A memory device according to claim 1 in which said at least one register has a number of memory elements which is one half or one third of the number of memory elements in a row of the DRAM.

3. A memory device according to claim 2 in which the cache memory comprises three said registers.

4. A memory device according to claim 1, further comprising operation means formed integrally with the DRAM and cache memory means and performing operations on data held in the cache memory.

5. A memory device according to claim 2, further comprising operation means formed integrally with the DRAM and cache memory means and performing operations on data held in the cache memory.

6. A memory device according to claim 3, further comprising operation means formed integrally with the DRAM and cache memory means and performing operations on data held in the cache memory.

7. A memory device according to claim 5, further comprising operation means formed integrally with the DRAM and cache memory means and performing operations on data held in the cache memory.

* * * * *